(12) United States Patent
Matsui et al.

(10) Patent No.: US 6,875,466 B2
(45) Date of Patent: Apr. 5, 2005

(54) SUBSTRATE PROCESSING METHOD AND SUBSTRATE PROCESSING APPARATUS

(75) Inventors: Hidefumi Matsui, Nirasaki (JP); Junichi Kitano, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 48 days.

(21) Appl. No.: 10/300,760

(22) Filed: Nov. 21, 2002

(65) Prior Publication Data

US 2003/0094137 A1 May 22, 2003

(30) Foreign Application Priority Data

Nov. 22, 2001 (JP) ........................................ 2001-358183

(51) Int. Cl.[7] ................................................. B05D 3/12
(52) U.S. Cl. .................... 427/240; 427/350; 427/369; 427/374.1; 427/377; 427/385.5; 427/425; 118/52; 118/58; 118/320; 438/778; 438/780
(58) Field of Search ................................. 427/240, 425, 427/377, 369, 370, 350, 374.1, 385.5; 118/52, 320, 58; 438/778, 780

(56) References Cited

U.S. PATENT DOCUMENTS

| | | | | |
|---|---|---|---|---|
| 5,658,615 A | * | 8/1997 | Hasebe et al. ............... | 427/240 |
| 5,667,942 A | * | 9/1997 | Nakao et al. ................ | 430/327 |
| 5,670,210 A | * | 9/1997 | Mandal et al. .............. | 427/240 |
| 5,944,894 A | * | 8/1999 | Kitano et al. ............... | 118/326 |
| 6,002,108 A | * | 12/1999 | Yoshioka ..................... | 219/388 |
| 6,040,120 A | * | 3/2000 | Matsushita et al. ......... | 430/347 |
| 6,254,936 B1 | * | 7/2001 | Gurer et al. ................. | 427/377 |
| 6,261,744 B1 | | 7/2001 | Yoshioka ..................... | 430/325 |
| 6,306,778 B1 | | 10/2001 | Sakai ........................... | 438/782 |

FOREIGN PATENT DOCUMENTS

| JP | 7-161619 A | * | 6/1995 |
|---|---|---|---|
| JP | 8-2764006 A | * | 10/1996 |

* cited by examiner

Primary Examiner—Kirsten Jolley
(74) Attorney, Agent, or Firm—Oblon, Spivak, McClelland, Maier & Neustadt, P.C.

(57) ABSTRACT

The wafer coated with the resist is deliberately placed in the vapor before being transferred to an aligner that exposes the resist on the wafer, the vapor, for example, the moisture, uniformly adheres onto the resist on the wafer. As a result, the substrate can uniformly be exposed in the following exposing process, and the uniformity of the line width and the like can be improved.

8 Claims, 11 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing apparatus for coating a semiconductor wafer with a resist and developing thereof in a fabrication of semiconductor device. In detail, the invention relates to a substrate processing apparatus that controls the atmosphere of the processing environment of the substrate.

2. Description of the Related Art

In a process of photolithography in the semiconductor device fabrication, the surface of a semiconductor wafer (hereinafter referred to as "a wafer") is coated with a photo-resist, exposing a mask pattern on the resist, then developing thereof, forming a resist pattern on the wafer surface. The resist coating and development are performed in an integrated coating and developing processing apparatus including a thermal processing apparatus such as a heating processing apparatus or a cooling processing apparatus. The coating and developing apparatus is connected to the aligner through an interface portion and the semiconductor device fabrication is actually performed.

In the coating and developing apparatus, when processing of wafer is performed, in order to prevent impurity such as particles from adhering to the wafer, the air cleaned with an air cleaner is supplied to the inside of the coating and developing processing apparatus as a down flow of air current, so that the wafer is processed in the clean condition.

However, these days, laser-beam light source with a short wavelength like, for example, $F_2$ excimer laser (157 nm) is used in an aligner to cope with the miniaturization of the devices, therefore in case that impurities of molecule level, which had not been a problem up to now, such as oxygen, ozone, water and organic matter, adheres on the resist film coated on the wafer in the steps performed before the exposure, absorption and scattering of light caused by the impurities tend to occur. When moisture adheres on the resist film, 2% of the light will be absorbed with film thickness of every 10 Å(1 mm), and when the water molecules exist scattering on the wafer surface, difference arises in amount of exposure between the portion with water molecules and the portion without the water molecules which causes deterioration in the uniformity of line width of the pattern. The down flow of the air described above is not able to remove the impurities of molecule level.

SUMMARY OF THE INVENTION

Considering the above-described circumstances, an object of the present invention is to provide a substrate processing method and substrate processing apparatus that improves the uniformity of line width even under a circumstance in which the impurities of molecule level exists.

To accomplish the above-described objects, the substrate processing method of the present invention comprises the steps of (a) coating a resist on the substrate and (b) placing the substrate coated with the resist in an atmosphere including a vapor. According to the aforesaid structure, for example, the vapor, such as water vapor uniformly adheres to the resist on the substrate by deliberately placing the substrate into the vapor before transferring thereof to an aligner that exposes the resist coated on the substrate. Therefore, the substrate could uniformly be exposed in the following exposing step, and the uniformity of the line width can be improved. Here, in order to have the moisture adhere uniformly on the substrate, a saturated vapor is preferably used in this case.

Another embodiment of the present invention further comprises the steps of (c) drying the substrate after the step (b) so that moisture adhered to the substrate remains on the surface of the substrate. In such manner, the moisture once adhered uniformly on the substrate is decreased by performing drying process uniformly so that the moisture adhered onto the surface of the substrate remains thereon. With this method, exposing process can be performed appropriately, thus the amount of exposure reaching the resist can be increased as much as possible while keeping the amount of exposure in the exposing step constant. In this case, in order to perform drying process uniformly on the substrate, heating the substrate is preferable as a drying process and the moisture adhered on the substrate to be evaporated uniformly. Alternatively, drying may be performed with supplying heating air uniformly all over the substrate.

According to another embodiment of the present invention, the step (b) has a step of controlling a pressure of the atmosphere around the substrate. The amount of evaporating moisture adhered on the substrate placed in the vapor can be controlled by controlling the pressure. Especially, another embodiment of the present invention is that the step (d) has the step of controlling the pressure so that the pressure becomes higher than an atmospheric pressure for a predetermined time period beginning from when the substrate is started to be placed in the vapor and the step of controlling the pressure so that the pressure becomes lower than the atmospheric pressure after the predetermined time period. As a result, the amount of moisture evaporate from the substrate can be restrained beginning from when the substrate is started to be placed in the vapor until the predetermined time passes, which causes acceleration in the effect of adhering moisture uniformly on the substrate. In addition, after the predetermined time, the moisture adhered onto the surface of the substrate is evaporated actively, for example, the substrate is subjected to the uniform drying process so that the moisture on the surface of the substrate is decreased to a predetermined amount. With this embodiment, the amount of exposure reaching the resist can be increased as much as possible while keeping the amount of exposure in the exposing step constant.

A substrate processing apparatus of the present invention comprises, a coating processing portion coating a resist on the substrate, a vapor processing portion placing the substrate coated with the resist in an atmosphere including a vapor and a transfer mechanism transferring the substrate at least between the coating processing portion and the vapor processing portion.

According to the aforesaid structure, the substrate is, for example, transferred to the vapor processing portion with the transfer mechanism before delivering thereof to the aligner that exposes the resist coated on the substrate. The vapor such as water vapor uniformly adheres to the resist on the substrate by deliberately placing the substrate therein. Therefore, the substrate could uniformly be exposed in the following exposing process, and the uniformity of the line width and the like can be improved. In order to have moisture uniformly adhere on the substrate, the vapor used in this case is preferred to be a saturated vapor.

Another embodiment of the present invention further comprises a drying processing portion drying the substrate so that the moisture adheres to a surface of the substrate remains thereon. The amount of moisture adhered uniformly on the substrate is decreased so that the moisture adhered on the surface of the substrate remains thereon in the drying processing portion of this kind. With this method, exposing process can be performed appropriately, thus the amount of exposure reaching the resist can be increased as much as possible while keeping the amount of exposure in the exposing step constant. In this case, in order to perform drying process uniformly on the substrate, drying by heating the substrate with a heating plate to have the moisture adhered to the substrate evaporate uniformly is preferable. Alternatively, drying can be performed with supplying heated air uniformly all over the substrate. Furthermore, the drying processing portion may be provided inside the vapor processing portion. Alternatively, the drying processing portion can be provided outside the vapor processing portion, and the substrate may be transferred between the vapor processing portion and the drying processing portion with, for example, the transfer mechanism.

According to another embodiment of the present invention, the vapor processing portion has a pressure controlling portion controlling a pressure of the atmosphere around the substrate. Especially the pressure controlling portion is preferred to control the pressure so that the pressure becomes higher than an atmospheric pressure for a predetermined time period beginning from when the substrate is started to be placed in the vapor and control the pressure so that the pressure becomes lower than the atmospheric pressure after the predetermined time period.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENT

Preferred embodiments of the present invention will be explained below with reference to the drawings.

Figure 1:
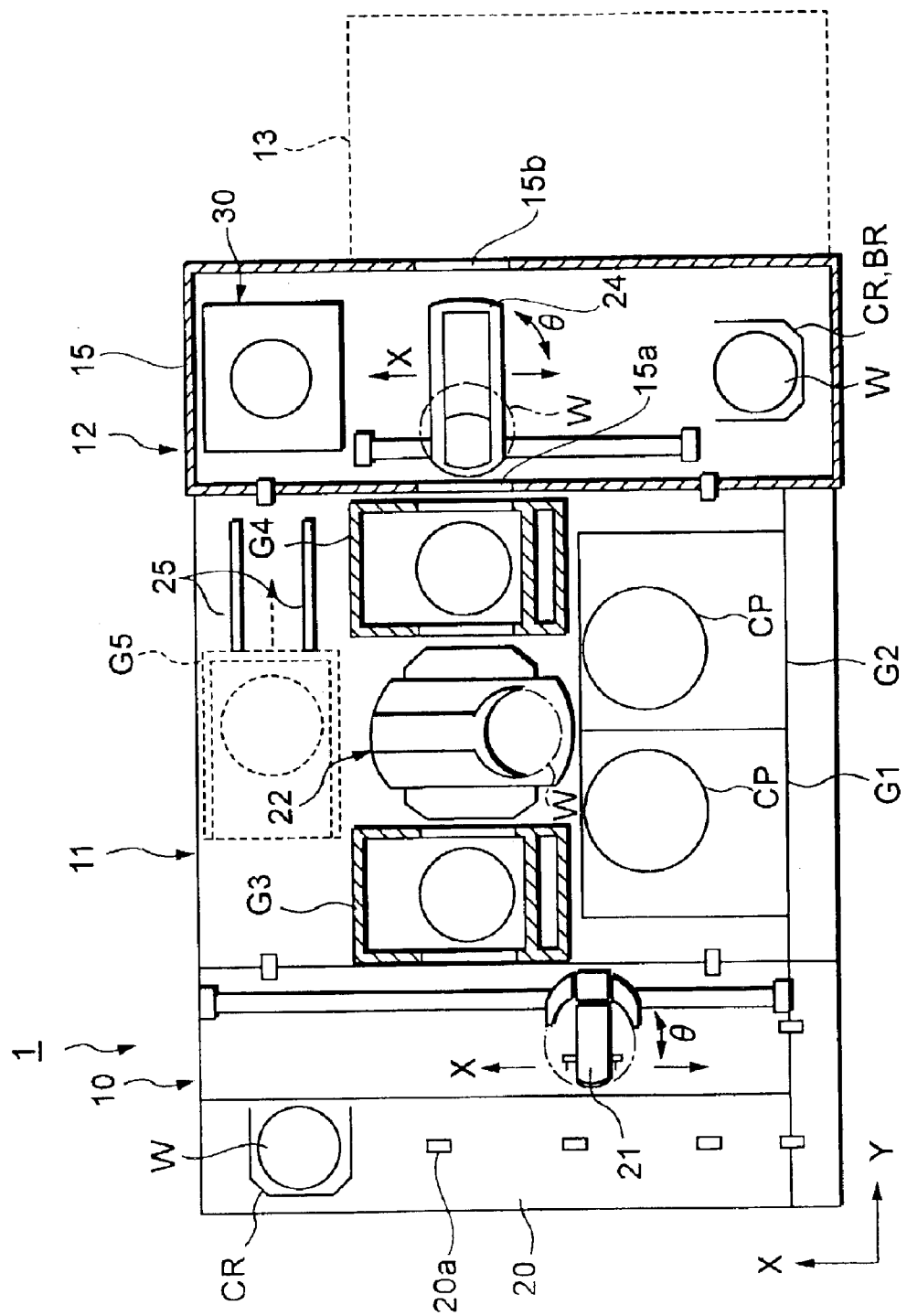
FIG. 1 is a plan view of a coating and developing processing apparatus according to a first embodiment of the present invention.
Figure 2:
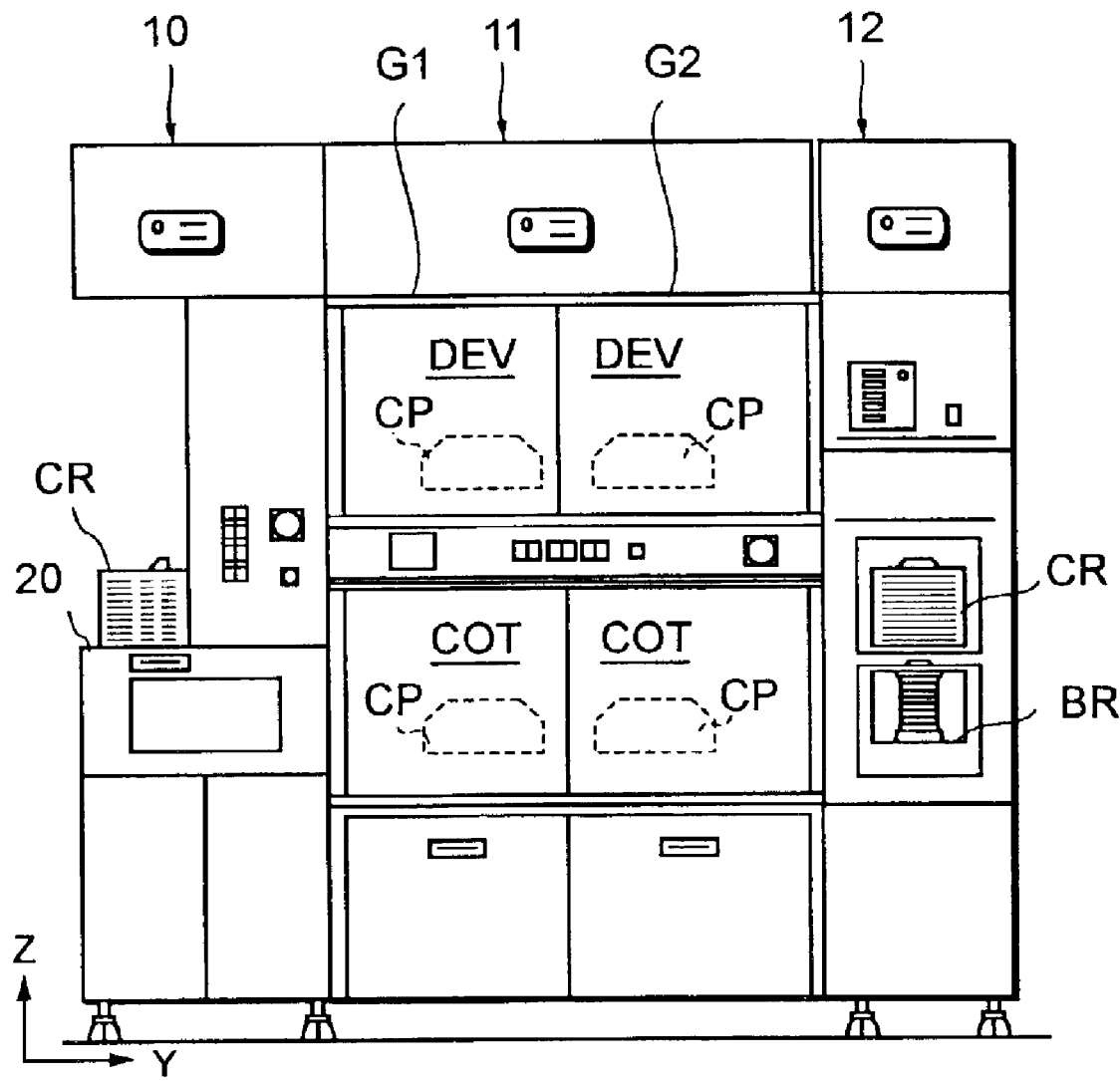
FIG. 2 is a front view of the coating and developing processing apparatus shown in FIG. 1.
Figure 3:
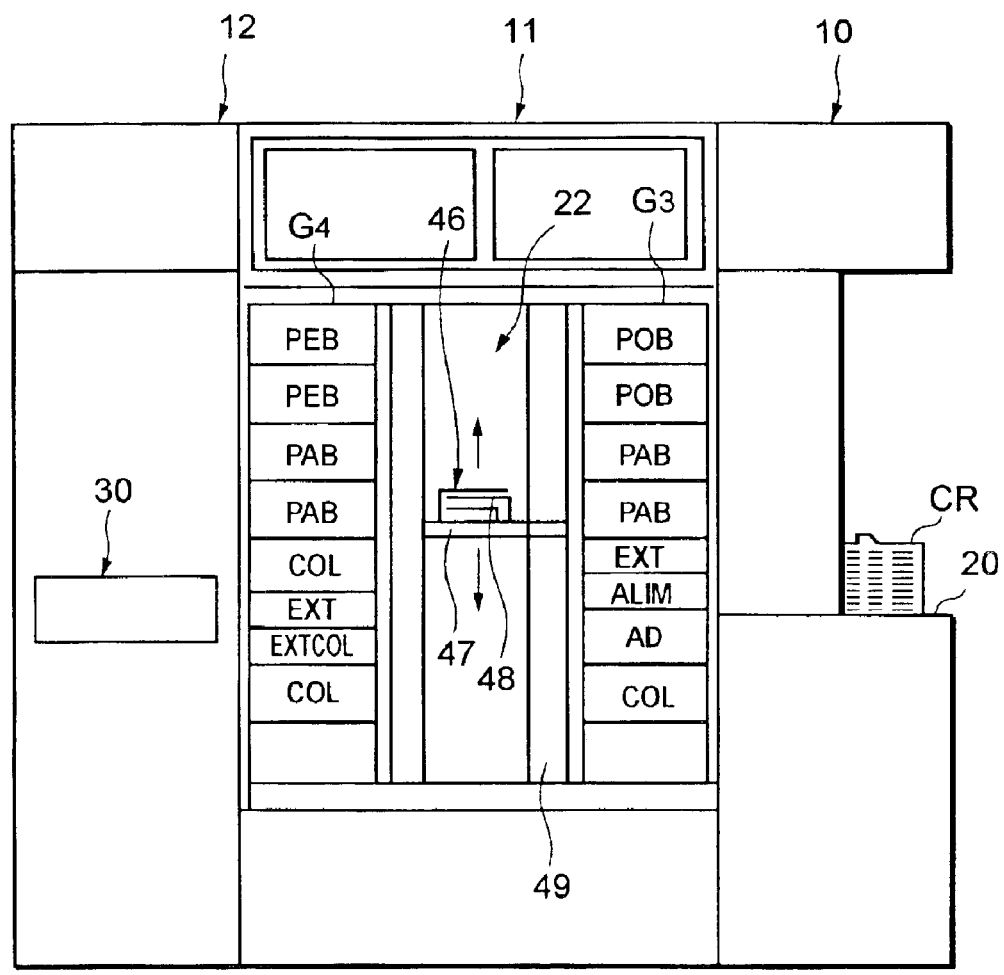
FIG. 3 is a rear view of the coating and developing processing apparatus shown in FIG. 1.

FIG. 1, FIG. 2 and FIG. 3 are diagrams showing a total configuration of a coating and developing processing apparatus according to an embodiment of the present invention. FIG. 1 is a plan view, FIG. 2 is a front view, and FIG. 3 is a rear view.

The coating and developing processing apparatus 1 has a structure in which a cassette station 10 provided for carrying a plurality of, for example, twenty-five semiconductor wafers W as substrates to be processed in a wafer cassette CR, as a unit, to the inside the apparatus 1 and carrying thereof to the outside of the apparatus 1 and also carrying in the substrates from the wafer cassette CR and carrying out the substrates from the cassette CR; a processing station 11 in which various kinds of processing units each for performing predetermined process for the semiconductor wafers W one by one in coating and developing processing steps that are multi-tiered; and an interface portion 12 for delivering and receiving the semiconductor wafer W with an aligner 13 disposed adjacent to the processing station 11, are integrally connected.

In the cassette station 10, as shown in FIG. 1, a plurality of, for example, up to four cassettes CR are placed in a line of an X-direction at positions of projections 20a provided for alignment thereof on a cassette mounting table 20, with respective outlet and inlet ports for the wafer W facing the processing station 11. A wafer transfer mechanism 21 movable in the direction of arrangement of the cassettes (an X-direction) and in the direction of arrangement of the wafers housed in the wafer cassette CR (a Z-direction) is structured to be selectively accessible to each of the wafer cassettes CR. Further, the wafer transfer mechanism 21 is structured so that it can be rotated in θ-direction so as to be accessible to a transfer and alignment unit (ALIM) and an extension unit (EXT) included in a multi-tiered unit portion of a third unit group G3 disposed at the processing station 11 side, as will be described later.

In the processing station 11, as shown in FIG. 1, a vertical carrier type of a main wafer transfer mechanism 22 is provided at a center, around which a group of or a plurality of groups of all processing units are multi-tiered. In this example, five processing unit groups G1, G2, G3, G4 and G5 are disposed multi-tiered. The multi-tiered units of the first and the second unit groups G1 and G2 are disposed on the front side of the apparatus adjacent with each other (the front in FIG. 1). The multi-tiered unit of the third unit group G3 is disposed adjacent to the cassette station 10 and the multi-tiered unit of the fourth unit group G4 is disposed adjacent to the interface portion 12. The multi-tiered unit of the fifth unit group G5 is disposed on the back side. In addition, the fifth unit group G5 is structured to be movable along the rail 25 for maintenance of the main wafer transfer mechanism 22.

As shown in FIG. 3, the main wafer transfer mechanism 22 has a wafer transfer device 46 that is capable of moving up and down in vertical direction (the Z-direction) inside a cylindrical supporter 49. The cylindrical supporter 49 is connected to a rotating shaft of a motor (not shown) and rotates integrally with the wafer transfer device 46 around the aforesaid rotating shaft by a rotational driving force of the motor. Thereby the wafer transfer device 46 can be rotated in θ-direction. The wafer transfer device 46 has, for example, three pairs of tweezers 48 moving forwards and backwards on a pedestal 47. The tweezers 48 holds and transfers the wafer.

As shown in FIG. 2, in the first unit group G1, two spinner-type processing units for performing predetermined processing while the wafer W is placed on a spin chuck in a cup CP, for example, a resist coating unit (COT) and a developing processing unit (DEV) are two-tiered from the bottom in order. Also in the second unit group G2, two spinner-type processing units, for example, the resist coating unit (COT) and the developing processing unit (DEV) are two-tiered from the bottom in order. Since the drainage of a resist solution is troublesome in terms of both mechanism and maintenance in the resist coating processing unit (COT), it is preferable to place the resist coating unit at the lower tier. However, it is possible to place thereof on the upper tier as necessary.

As shown in FIG. 3, in the third unit group G3, oven-type processing units each for performing predetermined processing while the wafer W is placed on a mounting table, for example, a cooling unit (COL), an adhesion unit (AD) an alignment unit (ALIM), an extension unit (EXT), a pre-baking unit (PAB), a post-baking unit (POB) are stacked from the bottom in order. Also in the fourth unit group G4, oven-type processing units, for example, two cooling units (COL), an extension and cooling unit (EXTCOL), an extension unit (EXT), a pre-baking unit (PAB) and a post-baking unit (POB) are stacked from the bottom in order.

By disposing the cooling unit (COL) and the extension unit (EXT), processing units with low processing temperature on the lower tier and disposing the baking unit (PAB) and the post-baking unit (POB), processing units with high processing temperature on the upper tier, thermal interference between the units can be reduced. However, it is also possible to dispose multi-tiered at random.

The interface portion 12 has the same size as the processing station 11 in the depth direction, but smaller in the width direction. A portable pick-up cassette CR and a fixed-type buffer cassette BR are disposed in two tiers at the front of the interface portion 12. A vapor processing unit 30, according to the present invention is disposed at the back. In the center, a wafer transfer mechanism 24 is disposed. The wafer transfer mechanism 24 moves in the X- and the Z-direction to get access to both cassettes CR and BR, and the vapor processing unit 30. The vapor processing unit 30 will be described later. The wafer transfer mechanism 24 is structured so that it can be rotated in θ-direction so as to be accessible to the extension unit (EXT) disposed in a multi-tiered unit portion of the fourth unit group G4 disposed at the processing station 11 side and to a transferring table (not illustrated) adjacent to the aligner 13 side.

As shown in FIG. 1, the interface portion 12 is surrounded by a wall member 15, and isolated from the outside atmosphere of the coating and developing processing apparatus 1. With this configuration, for example, inside of the interface portion 12 surrounded by the wall member 15 is purged with nitrogen gas or heating air to regulate oxygen concentration and humidity (moisture content) to low level. For example, the oxygen concentration is adjusted to be 1 ppm and moisture content to be 1 ppm. Further, openings 15a and 15b transferring the wafer W to the processing station 11 and to the aligner 13 respectively, are formed on the wall member 15 and the openings are structured to be able to open and close by a shutter (not shown). In such manner, by controlling the atmosphere inside the interface portion 12 precisely, impurities such as oxygen and moisture adhering to the wafer right before the exposing process with the aligner 13 can be prevented.

Figure 4:
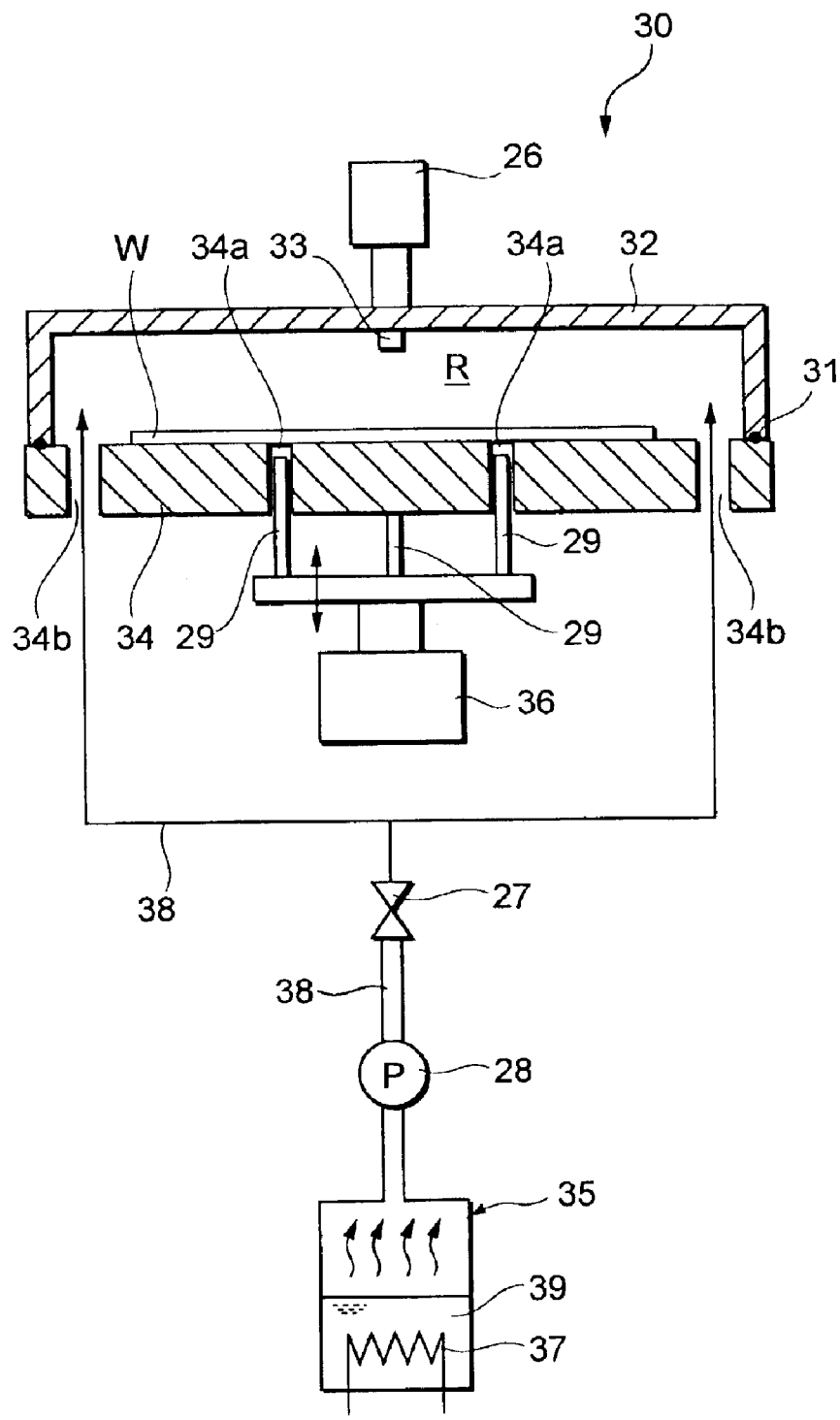
FIG. 4 is a sectional view of a vapor processing unit relating to the first embodiment of the present invention.

FIG. 4 is a sectional view of the vapor processing unit 30 relating to the above-mentioned first embodiment. In this vapor processing unit 30, for example, on an upper portion of cylindrically shaped holding table 34, provided for holding the wafer W, for example, a cylindrically shaped lid 32 is disposed. A lifting mechanism 26 configured of an air cylinder enables the lid 32 to be lifted and lowered. An O-ring for seal is attached to the lower end of the lid 32. When the lid 32 is lowered by the lifting mechanism 26, a processing chamber R is formed as the lower end portion thereof touches the holding table 34.

A plurality of holes 34a, for example three, pierces through the holding table 34. Three Support pins 29 supporting the wafer W from the back side are provided and a lifting cylinder 36 enables the support pins 29 to protrude and sink to the surface of the holding table 34 through the holes 34a. Thereby, the wafer W can be delivered to and received from the wafer transfer mechanism 24.

In addition, around the edge portion of the holding table 34, a plurality of supply ports 34b supplying vapor into the processing chamber R are provided. The vapor, for example, is supplied from a vapor generator 35 through a supply pipe 38 with a pump 28. The vapor generator 35 vaporizes, for example, ultra-pure water 39 by heating thereof with a heater 37. At the supply pipe 38, a regulating valve 27 regulating pressure and flow rate of the vapor is provided.

Inside the lid 32, a sensor 33 measuring humidity inside the processing chamber R is provided. The amount of vapor supplied can be controlled corresponding to, for example, the measuring result of the sensor 33.

Figure 5:
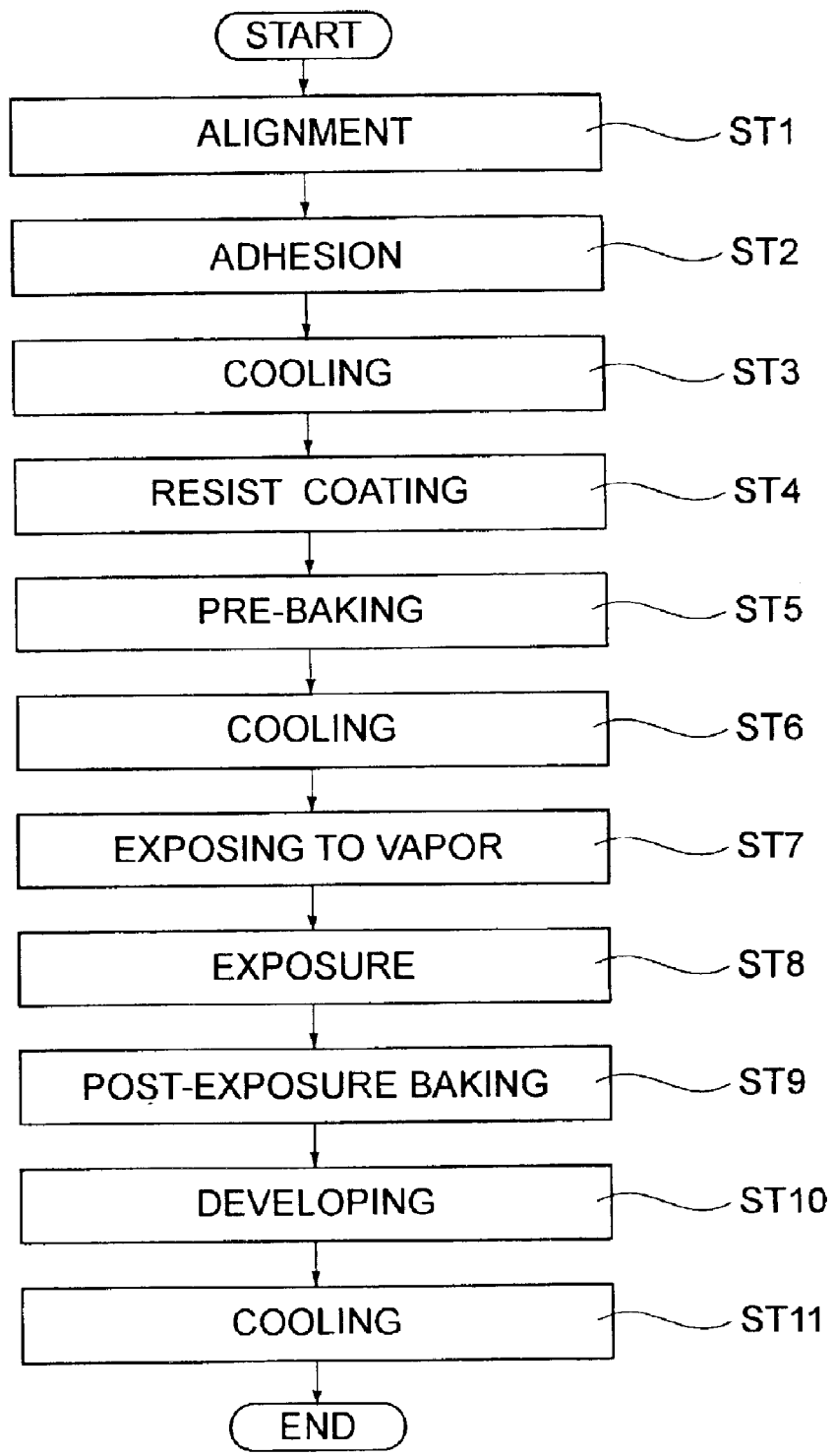
FIG. 5 is a flow chart showing a series of processing steps of the coating and developing processing apparatus.

A series of processing steps in the coating and developing processing apparatus 1 explained above will be explained with reference to the flow chart shown in FIG. 5.

First, in the cassette station 10, the wafer transfer mechanism 21 gets access to the cassette CR on the cassette mounting table 20, housing unprocessed wafers and takes one wafer W out of the cassette CR and transfers to the alignment unit (ALIM). After the alignment unit (ALIM) aligns the wafer w (step 1), the wafer W is transferred to the adhesion unit (AD) with the main wafer transfer mechanism 22 where hydrophobic process is performed (step 2) then to the cooling unit (COL) where a predetermined cooling process is performed (step 3). Thereafter, the wafer is transferred to the resist coating processing unit (COT) and the resist is spin coated thereon (step 4). Then a predetermined heating process is performed in the pre-baking unit (PAB) (step 5) followed by cooling process in the cooling unit (COL) (step 6). After that, in the interface portion 12, the wafer is transferred to the vapor processing unit 30 with the wafer transfer mechanism 24.

In the vapor processing unit 30, the wafer W is delivered to the supporting pins 29 on the holding table 34, and as the supporting pins 29 lowers, the wafer W is placed on the holding table 34 while the lid 32 is in its upper position. Then the lid 32 is lowered and the processing chamber R is formed (FIG. 4). Next, the vapor is supplied into the processing chamber R from the vapor generator 35 and the vapor is uniformly adhered to the front surface of the resist -film. With this configuration, the wafer can uniformly be exposed in the following exposing process and the uniformity of the line width can be improved (step 7).

In other words, according to the present embodiment, the amount of exposure reaching to the resist decreases as the vapor uniformly adheres on the resist, however, the wafer can uniformly be exposed compared with the prior art where the moisture exists scattered on the wafer. The decrease in the amount of exposure can be prevented with raising the intensity of the exposure. Also, regarding the supply of the vapor, it is preferable to have the processing chamber R saturated with vapor. In other words, the saturation causes the humidity to be approximately 100%, amount of moisture is increased as much as possible, thereby enabling the vapor to adhere more uniformly on the wafer. The second and the following embodiments described below also carry out vapor processing with the saturated vapor. However, it is not always necessary to process in the saturated state.

The wafer transfer mechanism 24 transfers the wafer W to the aligner 13 and the exposing process is performed therein (step 7). After the exposing process, the heating process in the post exposure baking unit (PEB) is performed (step 8). After that, the wafer W is transferred to the developing processing unit (DEV) and the developing process is performed (step 9). Then the predetermined heating process is performed in the post-baking unit (POB) (step 10). Thereafter the wafer W is subjected to a predetermined cooling process in the cooling unit (COL) (step 11), and returned to the cassette CR through the extension unit (EXT).

Figure 6:
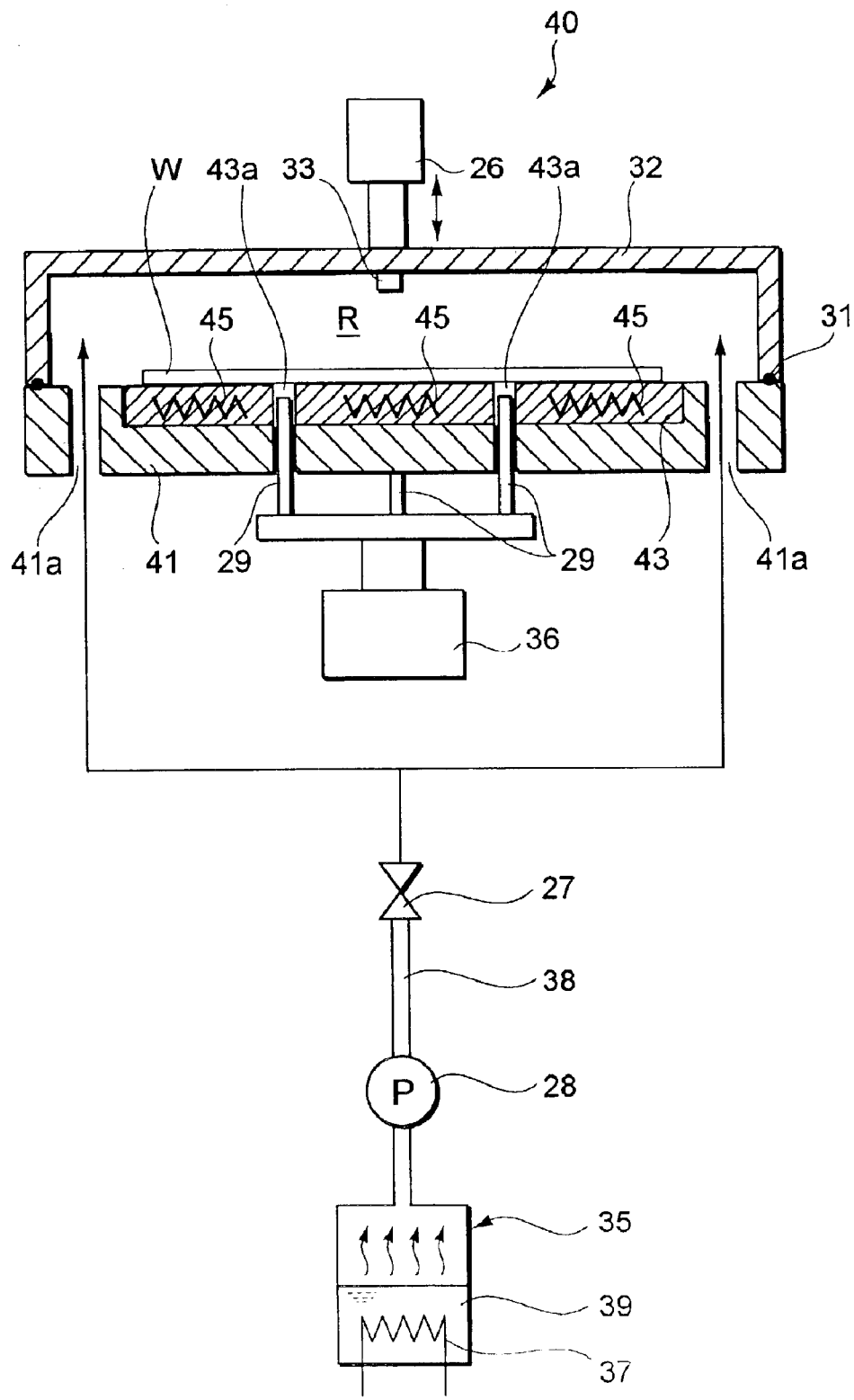
FIG. 6 is a sectional view of the vapor processing unit relating to the second embodiment of the present invention.

FIG. 6 is a sectional view showing a vapor processing unit according to the second embodiment of the present invention. Incidentally in FIG. 6, the same numerals and symbols will be used to designate the same components as those in FIG. 4, and the explanation thereof will be omitted. A heating plate 43 heating the wafer W by placing the wafer W thereon is disposed on the holding table 41 in the vapor processing unit 40. The heating plate 43 has, for example, a heater 45 and the wafer W is heated thereby. On the heating plate 43, three holes 43*a* are formed and the supporting pins 29 protrude and sink therethrough. With such configuration, the wafer W can be delivered and received from the outside. Meanwhile, a supply port 41*a* for supplying the vapor from the vapor generator 35 into the processing chamber R is formed on the holding table 41.

With regard to the processing steps of the vapor processing unit 40, first of all, the wafer W is placed on the heating plate 43 and the lid 32 is lowered to form the processing chamber R. Then, the vapor is supplied into the processing chamber R from the vapor generator 35 and adhered uniformly onto the front surface of the resist film. With this structure, the wafer can uniformly be exposed in the following exposing process and the uniformity of the line width and the like can be improved.

Next, the wafer W is heated with the heating plate 43 at a predetermined temperature for a predetermined time period. With this method, the moisture adhered on the wafer W can be evaporated so that the moisture remains on the surface of the wafer W. In such manner, the moisture adhered uniformly on the substrate is decreased by heating the wafer W uniformly so that the moisture adhered to the surface thereof remains thereon, in other words, the drying process is being performed to the wafer W. This enables the exposing process to be performed appropriately, thus the amount of exposure reaching the resist can be increased as much as possible while keeping the amount of exposure in the exposing step constant.

Figure 7:
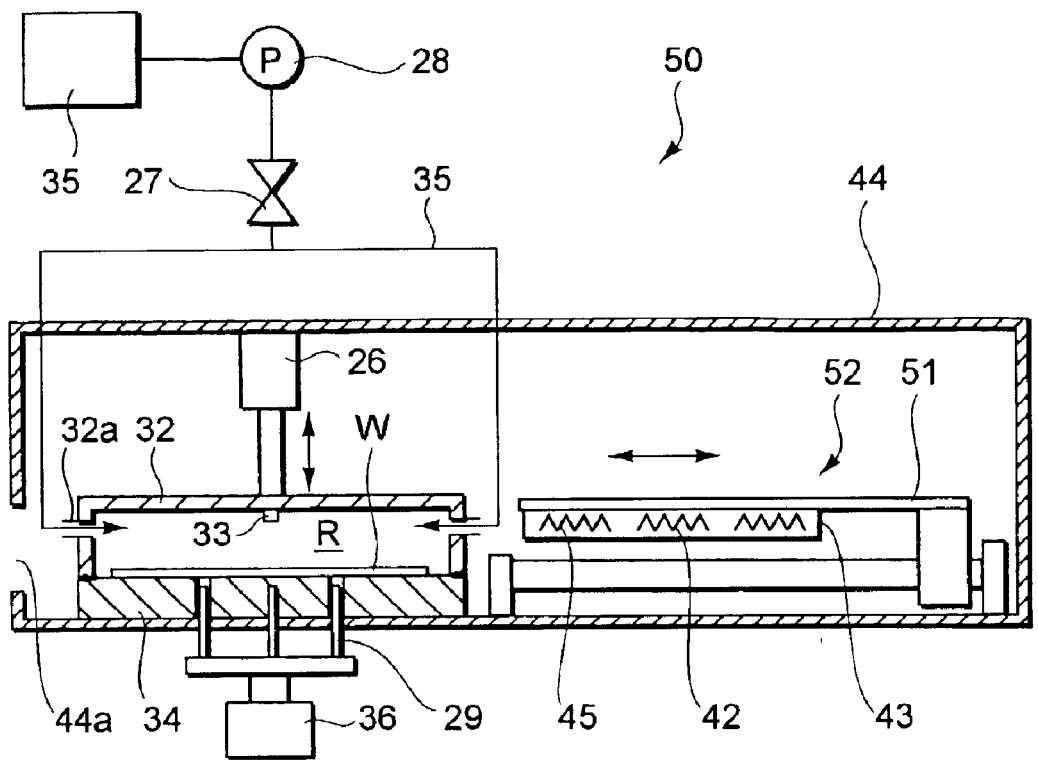
FIG. 7 is a sectional view of the vapor processing unit relating to the third embodiment of the present invention.

FIG. 7 is a sectional view showing a vapor processing unit according to the third embodiment of the present invention. Incidentally in FIG. 7, the same numerals and symbols will be used to designate the same components as those in FIG. 4, and the explanation thereof will be omitted. A similar apparatus to the vapor processing unit in FIG. 4 is disposed inside the case 44 in the vapor processing unit 50. A transferring body 52 moving horizontally along with a rail 42 with the cylinder mechanism or a belt mechanism is disposed adjacent to the apparatus. A heating plate 43 supported by the supporting plate 51 is provided on the transferring body 52. In addition, according to the embodiment, a supply port 32*a* is formed at the side portion of the lid 32, as illustrated, and the vapor from the vapor generator 35 is supplied into the processing chamber R through the supply port 32*a* In the case 44 an opening 44*a* is provided for delivering the wafer W to and receiving the wafer W from the outside.

With regard to the processing steps of the vapor processing unit 50, first of all, when the wafer W is placed on the holding table 34 with the holding pins 29, the lid 32 lowers to form the processing chamber R. Then, the vapor is supplied into the processing chamber R from the vapor generator 35 and uniformly adheres on the surface of the resist film on the wafer. In such manner, the wafer can uniformly be exposed in the following exposing process and the uniformity of the line width and the like can be improved.

Figure 8:
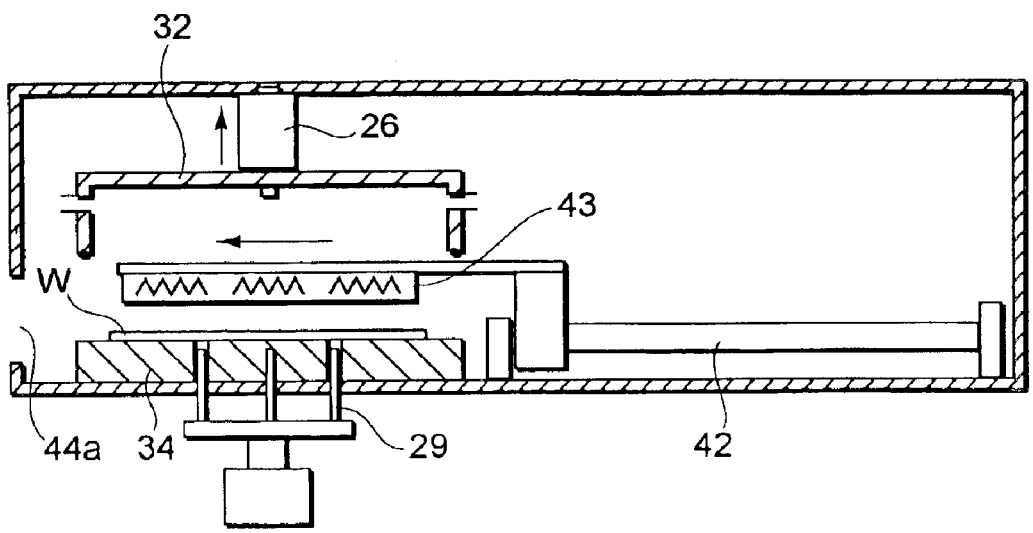
FIG. 8 is a sectional view, showing the case when the heating process is performed in the vapor processing unit shown in FIG. 7.

Next, as shown in FIG. 8, the lid 32 rises and the transferring body 52 approaches. Then the heating plate 43 moves to right above the wafer W and stops subjecting the wafer W to the heating process at a predetermined temperature for a predetermined time period. In such manner, similar to the second embodiment described above, the moisture adhered on the wafer W can be evaporated so that the moisture remains on the surface thereof. This causes the exposing process to be performed appropriately, thus the amount of exposure reaching the resist can be increased as much as possible while keeping the amount of the exposure in the exposing step constant.

Figure 9:
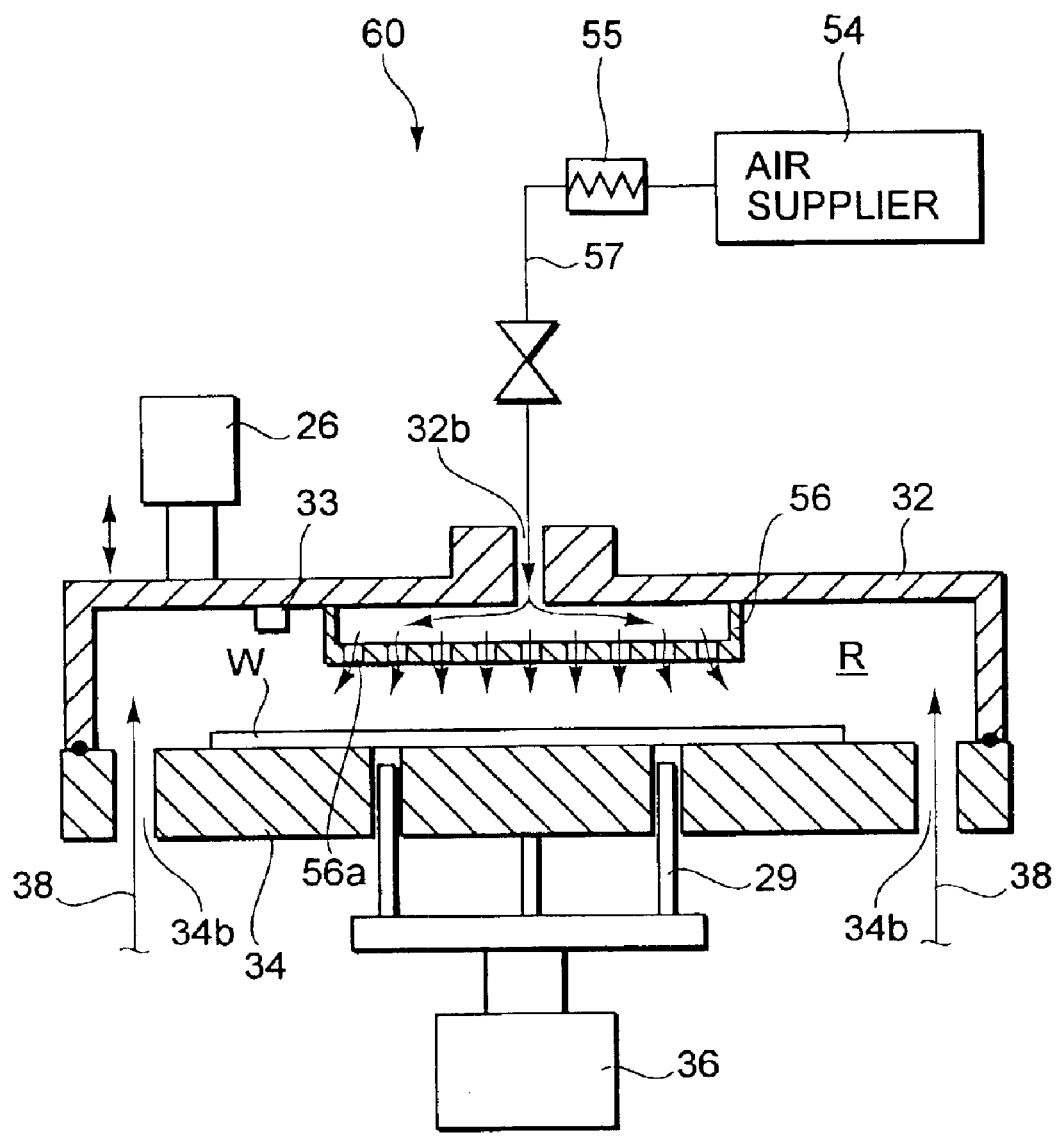
FIG. 9 is a sectional view of a vapor processing unit according to the fourth embodiment of the present invention.

FIG. 9 is a sectional view showing a vapor processing unit according to the fourth embodiment of the present invention. Incidentally, in FIG. 9, the same numerals and symbols will be used to designate the same components as those in FIG. 4, and the explanation thereof will be omitted. In the central portion of the lid 32 in the vapor processing unit 60, an air supply port 32*b* is formed for supplying air into the processing chamber R from the air supply source 54 through a supply pipe 57. The air from the air supply source 54 is supplied heated, for example, with a heater 55 to a predetermined temperature, for example, 50° C. to 100° C. On the inside ceiling of the lid 32, a defusing member 56 is attached for defusing the air supplied as above uniformly inside the processing chamber R. A plurality of small holes 56*a* are formed on the defusing member 56. In such manner, the air spreads out as far as the edge of the wafer W.

Furthermore, although not illustrated, similar to each of the aforesaid embodiments, the vapor is supplied from the supply port 34*b* of the holding table 34 in this embodiment.

According to the present embodiment, first of all, the vapor is supplied and the vapor uniformly adheres to the front surface of the resist film coated on the wafer W. Next, the drying process is performed blowing heating air onto the surface of the wafer W, causing the moisture adhered on the wafer W to evaporate so that the moisture remains on the surface of the wafer W.

With such processing method, similar to each of the aforesaid embodiments, the amount of exposure reaching the resist can be increased as much as possible while keeping the amount of exposure in the exposing step constant.

The present invention is not limited to an embodiment as described above, however, various kinds of modification is possible.

Figure 10:
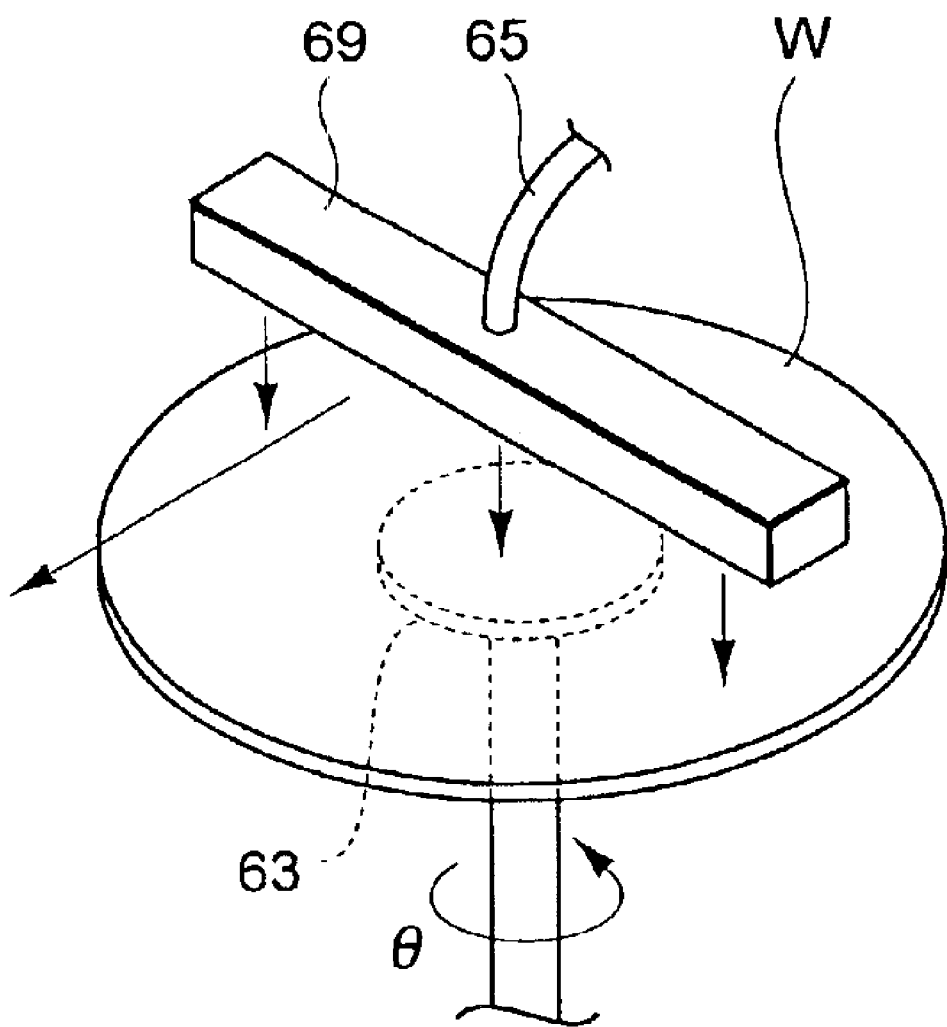
FIG. 10 is a perspective view of the unit supplying ultra-pure water or vapor from the nozzle by roating the substrate.

For example, as shown in FIG. 10, the wafer W can be spun in θ-direction while being held with a spin chuck 63 which rotatably holds the wafer W and ultra-pure water is supplied onto the surface of wafer W with a stick-shaped supply nozzle 69 having a slit shaped discharge opening (not shown) and the moisture may be adhered uniformly on the wafer W coated with the resist. In addition, in this case, the vapor may be gushed out from the supply nozzle 69 while rotating the wafer W.

The holding table 34 as shown in FIGS. 7 and 8, may be replaced with, for example, a cooling plate having a cooling means such as cooling water or Peltier element. With this embodiment, a cooling process by the cooling plate can be performed after the heating process performed with the transferring body 52 as shown in FIG. 8. Throughput can be improved compared to a case, for example, where the wafer is transferred to another cooling unit for the cooling process to be performed.

Furthermore, a semi-conductor wafer is used as a substrate in each of the embodiments described above, however, the present invention can also be applied to a substrate such as a glass substrate used for a liquid crystal display and the like.

Figure 11:
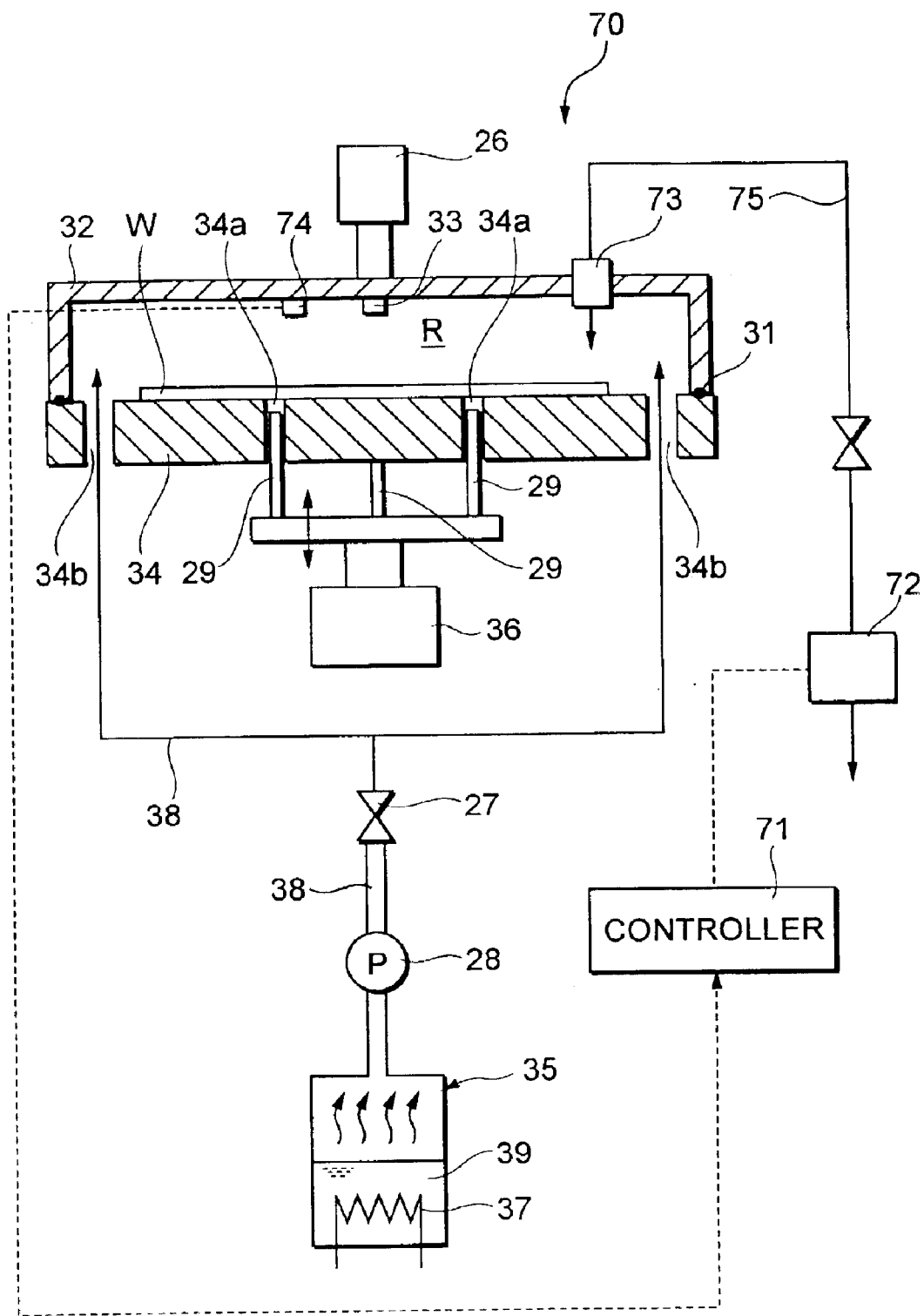
FIG. 11 is a sectional view of a vapor processing unit according to the fifth embodiment of the present invention.

FIG. 11 is a sectional view showing a vapor processing unit according to the fifth embodiment of the present invention. Incidentally in FIG. 11, the same numerals and symbols will be used to designate the same components as those in FIG. 4, and the explanation thereof will be omitted.

A vapor processing unit 70 has an increasing and reducing pressure apparatus 72. A pipe 75 is connected between the increasing and reducing pressure apparatus 72 and an air introduction and exit port 73 provided on the lid 32 and the increasing and reducing pressure apparatus 72 controls the pressure inside the processing chamber R under control of a controller 71. As the increasing and reducing pressure apparatus 72, a vacuum pump and the like which introduces air into and sucks out the air out of the processing chamber R can be used.

A pressure measuring sensor 74 is attached, for example, to the inside of the lid 32. The pressure measuring sensor 74 detects the pressure inside the processing chamber R and the controller 71 controls the increasing and reducing pressure apparatus 72 corresponding to the detected results of the pressure measuring sensor 74.

In the vapor processing unit 70 structured as above, the pressure inside the processing chamber R is controlled, therefore, the amount of water adhered to the wafer W as a result of the vapor processing can be adjusted. Thus, dryness of the wafer can freely be controlled.

One example of an operation of the vapor processing unit 70 structured in such manner will be described fully. First, after the wafer W is placed on the holding table 34 and the lid 32 is lowered and become hermetically sealed, the vapor is supplied into the processing chamber R with the vapor generator 35. Then, the increasing and reducing pressure apparatus 72 is activated, for example, while the vapor flowing into the processing chamber R or after the inflow of the vapor is stopped, so that the pressure inside the processing chamber R becomes bigger, for example, than the atmospheric pressure. In such manner, the vapor evaporated from the substrate can be restrained for a predetermined time period starting from the exposure of the substrate to the vapor, and the effect of adhering the vapor uniformly on the substrate is encouraged. The predetermined time period may be, for example, several seconds to several minutes, the same can be applied to the examples hereafter.

On the other hand, after the predetermined time period is passed, the pressure inside the processing chamber R is adjusted to be smaller than the atmospheric pressure. As a result, after the predetermined time period is passed, the moisture adhered on the surface of the wafer W is actively vaporized and the drying process can be performed uniformly, for example, up to a point where the predetermined amount of moisture remains on the surface of the wafer W. In other words, drying process under reduced pressure may be performed. With this method, the amount of exposure reaching the resist can be increased as much as possible, while keeping the uniformity in the amount of exposure in the exposing step constant.

Figure 12:
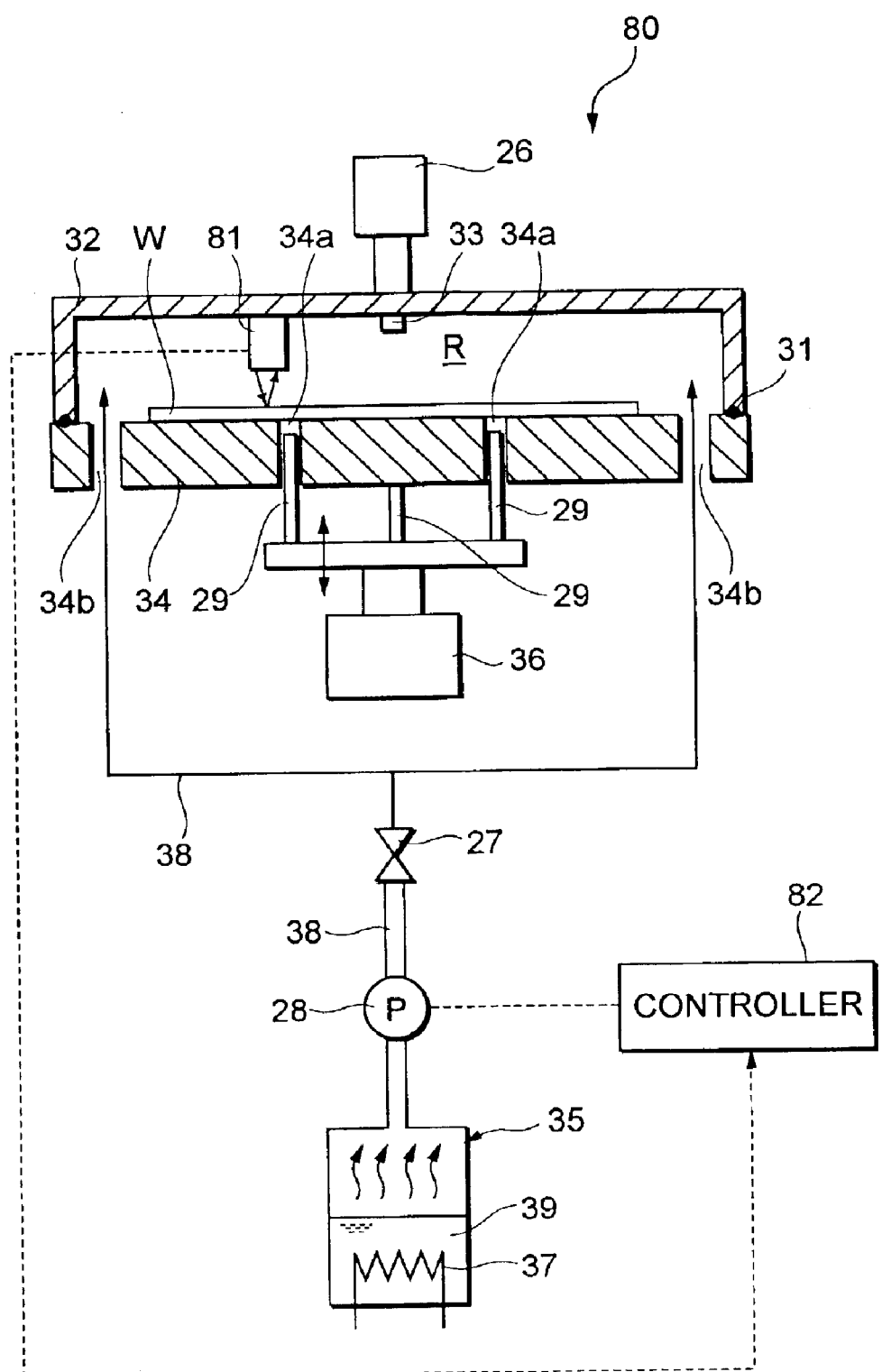
FIG. 12 is a sectional view of a vapor processing unit according to the sixth embodiment of the present invention.

FIG. 12 is a sectional view showing a vapor processing unit according to the sixth embodiment of the present invention. Incidentally, in FIG. 12, the same numerals and symbols will be used to designate the same components as those in FIG. 4, and the explanation thereof will be omitted.

In a vapor processing unit 80, a moisture film thickness measuring apparatus 81 is attached inside the lid 32. The moisture film thickness measuring apparatus 81 measures the film thickness of the vapor adhered to the surface of the wafer W, after the wafer W is exposed to the vapor. As the moisture film thickness measuring apparatus 81, for example, an apparatus using a principle of measuring the film thickness with light interference can be used.

A controller 82 controls switching of the pump 28 corresponding to the measurement result of the moisture film thickness measuring apparatus 81, therefore, the amount of vapor supplied into the processing chamber R can be controlled.

One example of an operation of the vapor processing unit 80 structured in such manner will be described concretely. First, after the wafer W is placed on the holding table 34, the lid 32 is lowered to become hermetically sealed, the vapor is supplied into the processing chamber R with the vapor generator 35. Then, for example, while the vapor is flowing into the processing chamber R, the moisture film thickness measuring apparatus 81 measures the film thickness of the moisture adhered on the surface of the wafer W. A controller 82 controls switching of the pump 28 corresponding to the measurement result, therefore, the amount of vapor supplied into the processing chamber R is controlled. One example of an operation of the vapor processing unit 70 structured in such manner will be described concretely. First, after the wafer W is placed on the holding table 34, the lid 32 is lowered to become hermetically sealed, the vapor is supplied into the processing chamber R with the vapor generator 35. Then, for example, while the vapor is flowing into the processing chamber R, the moisture film thickness measuring apparatus 81 measures the film thickness of the moisture adhered on the surface of the wafer W. After that, for example when the moisture film thickness reaches to a predetermined value, the supply of the vapor is stopped. With this configuration, an appropriate amount of vapor can uniformly be adhered onto the surface of the wafer W. As a result, a minimum amount of moisture can be adhered onto the wafer W by supplying minimum amount of vapor, therefore, excessive supply of vapor can be prevented. In the same time, the drying process described in the above mentioned second and third embodiments and the like can be omitted, which causes the processing time to be shortened.

Incidentally, according to the sixth embodiment, the measurement of the moisture film thickness measuring apparatus 81 may not be included in the above-mentioned processing unit 80, but may be included in a separate measuring unit. In that case, the vapor processed wafer may be transferred to the separate measuring unit after the completion of the vapor process in the vapor processing unit, and the measurement with the moisture film thickness measuring apparatus 81 may be performed.

Moreover, instead of using the moisture film thickness measuring apparatus 81, for example, wetting condition on the surface of the wafer W may be picked up as an image using an image pick-up apparatus like a CCD camera.

As described above, according to the present invention, by placing a substrate coated with resist in vapor, moisture adheres uniformly on the resist of the substrate, therefore, the uniform exposure can be realized in an exposing step, and uniformity of the line width and the like can be improved.

The disclosure of Japanese Patent Application No. 2001-358183 filed Nov. 22, 2001 including specification, drawings and claims are herein incorporated by reference in its entirety.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for processing a substrate, comprising:
    coating a resist on the substrate;
    heating the substrate coated with the resist;
    cooling the heated substrate;
    placing the cooled substrate in an atmosphere including a vapor;
    drying the substrate after the placing so that a moisture adhered to the substrate remains on the surface of the substrate; and
    transferring the substrate to an aligner after the drying step.

2. The method, as set forth in claim 1, wherein the substrate is placed in a saturated vapor.

3. The method, as set forth in claim 1, wherein the drying further comprises heating the substrate.

4. The method, as set forth in claim 1, wherein the drying comprises blowing heated air onto the surface of the substrate.

5. The method, as set forth in claim 1, further comprising:
    subsequent to the placing, measuring a pressure of the atmosphere; and
    controlling a pressure of the vapor according to the measured pressure.

6. The method, as set forth in claim 5, wherein the controlling comprises controlling the pressure of the vapor so that the pressure of the vapor becomes higher than an atmospheric pressure, for a predetermined time period beginning from when the substrate is placed in the vapor, and controlling the pressure of the vapor so that the pressure of the vapor becomes lower than the atmospheric pressure after the predetermined time period.

7. The method, as set forth in claim 1, further comprising:
    subsequent to the placing, measuring a thickness of the vapor adhered on a surface of the substrate; and
    controlling an amount of the vapor in the atmosphere according to the measured thickness.

8. The method, as set forth in claim 4, wherein a temperature of the heated air ranges from 50 to 100° C.

* * * * *